(12) United States Patent
Shirakawa

(10) Patent No.: US 8,593,872 B2
(45) Date of Patent: Nov. 26, 2013

(54) NONVOLATILE SEMICONDUCTOR MEMORY DEVICE CAPABLE OF SPEEDING UP DATA WRITE

(75) Inventor: Masanobu Shirakawa, Chigasaki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 369 days.

(21) Appl. No.: 13/157,603

(22) Filed: Jun. 10, 2011

(65) Prior Publication Data

US 2012/0069667 A1 Mar. 22, 2012

(30) Foreign Application Priority Data

Sep. 22, 2010 (JP) ................................ 2010-212720

(51) Int. Cl.
*G11C 11/34* (2006.01)

(52) U.S. Cl.
USPC ............ 365/185.18; 365/185.11; 365/185.17; 365/185.22

(58) Field of Classification Search
USPC ............. 365/185.11, 185.17, 185.18, 185.22, 365/185.19, 185.21, 185.23, 185.24
See application file for complete search history.

(56) References Cited

U.S. PATENT DOCUMENTS

| | | | |
|---|---|---|---|
| 2009/0268523 | A1 | 10/2009 | Maejima |
| 2010/0020602 | A1* | 1/2010 | Baek et al. ............... 365/185.03 |
| 2010/0054041 | A1* | 3/2010 | Nobunaga ................ 365/185.19 |
| 2010/0061149 | A1* | 3/2010 | Hosono et al. ........... 365/185.03 |

FOREIGN PATENT DOCUMENTS

| | | |
|---|---|---|
| JP | 11-66871 | 3/1999 |
| JP | 11-162199 | 6/1999 |
| JP | 2000-236031 | 8/2000 |
| JP | 2002-25280 | 1/2002 |
| JP | 2003-208793 | 7/2003 |
| JP | 2007-257739 | 10/2007 |
| JP | 2008-10076 | 1/2008 |
| JP | 2008-536247 | 9/2008 |
| JP | 2008-536248 | 9/2008 |
| JP | 2009-146954 | 7/2009 |
| JP | 2009-230818 | 10/2009 |
| JP | 2009-266946 | 11/2009 |
| JP | 2009-301607 | 12/2009 |
| JP | 2010-118580 | 5/2010 |
| JP | 2010-161199 | 7/2010 |
| JP | 2010-199235 | 9/2010 |

OTHER PUBLICATIONS

Office Action issued on Dec. 18, 2012 in the corresponding Japanese Patent Application No. 2010-212720 (with English Translation).

* cited by examiner

*Primary Examiner* — Harry W Byrne
*Assistant Examiner* — Hien Nguyen
(74) *Attorney, Agent, or Firm* — Oblon, Spivak, McClelland, Maier & Neustadt, L.L.P.

(57) ABSTRACT

According to one embodiment, a nonvolatile semiconductor memory device includes a memory cell array and a control circuit. The memory cell array having a plurality of memory cells is connected to a plurality of word lines stacked on a semiconductor substrate, and the memory cells having a charge accumulation layer, and the charge accumulation layers are united between adjacent memory cells. When writing data to a memory cell group connected to the nth (n is a natural number) word line of the memory cell array, the control circuit controls to simultaneously apply the same program voltage to memory cell groups connected to the (n−1)th and (n+1)th word lines.

12 Claims, 12 Drawing Sheets

NONVOLATILE SEMICONDUCTOR MEMORY DEVICE CAPABLE OF SPEEDING UP DATA WRITE

CROSS-REFERENCE TO RELATED APPLICATIONS

This application is based upon and claims the benefit of priority from Japanese Patent Application No. 2010-212720, filed Sep. 22, 2010; the entire contents of which are incorporated herein by reference.

FIELD

Embodiments described herein relate generally to a nonvolatile semiconductor memory device having a stacked memory cell structure.

BACKGROUND

A stacked NAND, that is, a so-called BiCS (Bit-Cost Scalable) memory including stacked memory cells has recently been proposed as an approach to improvement of the bit density of a NAND flash memory.

DETAILED DESCRIPTION

In general, according to one embodiment, a nonvolatile semiconductor memory device includes a memory cell array and a control circuit. The memory cell array having a plurality of memory cells is connected to a plurality of word lines stacked on a semiconductor substrate, and the memory cells having a charge accumulation layer, and the charge accumulation layers are united between adjacent memory cells. When writing data to a memory cell group connected to the nth (n is a natural number) word line of the memory cell array, the control circuit controls to simultaneously apply the same program voltage to memory cell groups connected to the (n−1)th and (n+1)th word lines.

This embodiment provides a nonvolatile semiconductor memory device capable of speeding up data write.

The embodiment will now be described with reference to the accompanying drawings. In the following description, the same reference numerals denote the same parts throughout the drawings. In addition, the dimensional ratios in the drawings are not limited to those illustrated.

(First Embodiment)

A three-dimensional stacked nonvolatile semiconductor memory device according to the first embodiment will be described first with reference to the block diagram of FIG. 6.

[Arrangement of Nonvolatile Semiconductor Memory Device]

The three-dimensional stacked nonvolatile semiconductor memory device of this embodiment includes a BiCS flash memory 10 and a memory controller (also referred to as an external controller) 20. The BiCS flash memory 10 comprises a memory cell array 11, a sense amplifier 12, a column address buffer/column decoder 13, a row decoder 14, a control circuit (also referred to as an internal controller) 15, a voltage generation circuit 16, a power-on detection circuit 17, a row address buffer 18, and an input/output buffer 19.

<Memory Cell Array>

The memory cell array 11 according to this embodiment will be described first with reference to FIGS. 1, 2, and 3.

Figure 1:
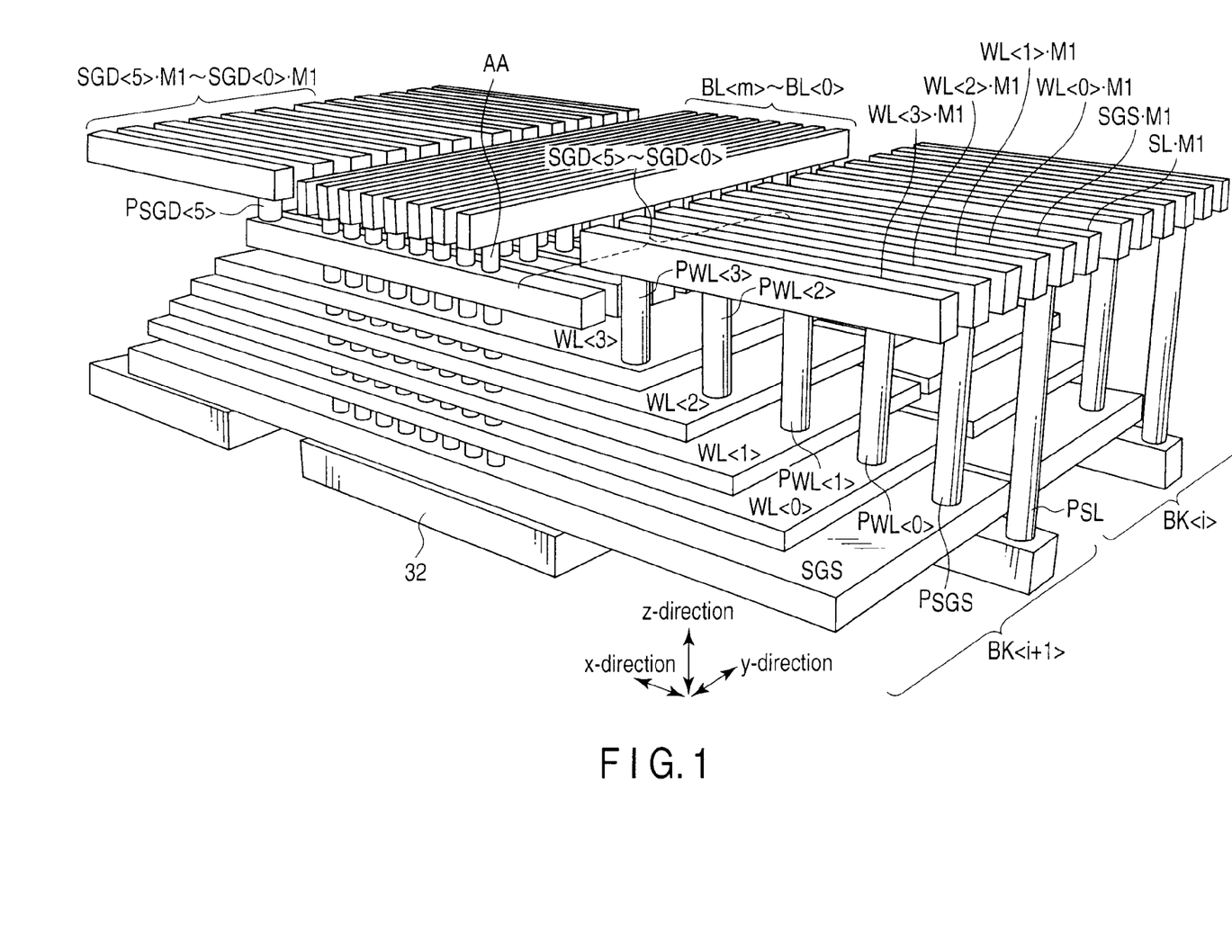
FIG. 1 is a perspective view showing an example of the element structure of a nonvolatile semiconductor memory device according to the first embodiment.

The memory cell array 11 has an element structure as shown in the perspective view of FIG. 1. The memory cell array 11 has a plurality of blocks each serving as an erase unit. FIG. 1 illustrates two blocks BK<i> and BK<i+1> for the descriptive convenience.

As shown in FIG. 1, the blocks are formed from a source diffusion layer 32, conductive layers (SGS, SGD, and WL<0> to WL<3> are shown in FIG. 1) formed above the source diffusion layer 32, active layers AA, and the like.

<<Source Diffusion Layer>>

For example, one source diffusion layer 32 is formed in a semiconductor substrate 31 so as to be shared by all blocks BK in the same plane. The source diffusion layer 32 is connected to a source line SL·M1 via a contact plug $P_{SL}$.

In addition, three or more conductive layers made of, for example, conductive polysilicon are stacked on the source diffusion layer 32 with interlayer dielectric films (not shown) inserted between them.

<<Conductive Layer>>

In this embodiment, six conductive layers are stacked with interlayer dielectric films inserted between them. In FIG. 1, the conductive layers are word lines WL<0> to WL<3>, the drain-side select gate line (first select gate line) SGD, and the source-side select gate line (second select gate line) SGS.

Each of the five conductive layers other than the uppermost layer (SGD<0> to SGD<5> in FIG. 1) is formed into a plate shape in one block BK<i+1>. The x-direction ends of the six conductive layers are terraced as a whole so as to ensure contact with the respective conductive layers. For example, word line WL<0> is formed above the source-side select gate line SGS but not above the region to make contact with the source-side select gate line SGS. That is, word line WL<0> is formed to be shorter than the source-side select gate line SGS in the x-direction. Similarly, word line WL<1> is formed to be shorter than word line WL<2> in the x-direction. Word line WL<2> is formed to be shorter than word line WL<3> in the x-direction. Word line WL<3> is formed to be shorter than the drain-side select gate line SGD in the x-direction.

The lowermost layer is the source-side select gate line SGS. The four remaining conductive layers other than the lowermost and uppermost layers are word lines WL<0>, WL<1>, WL<2>, and WL<3>.

The uppermost layer is formed from a plurality of conductive lines running in the x-direction. For example, six conductive lines are arranged in one block BK<i+1>. For example, the six conductive lines of the uppermost layer are drain-side select gate lines SGD<0> to SGD<5>.

<<Active Layer>>

The plurality of active layers (active areas) AA that construct NAND strings (to be described later with reference to FIG. 3) are formed into a pillar shape in the z-direction (perpendicular to the surface of the semiconductor substrate). The active layers AA extend from the source diffusion layer 32 to bit lines BL through the plurality of conductive layers.

The upper ends of the plurality of active layers AA are connected to a plurality of bit lines BL<0> to BL<m> running in the y-direction. The source-side select gate line SGS is connected to a lead SGS·M1 running in the x-direction via a contact plug $P_{SGS}$. Word lines WL<0> to WL<3> are connected to leads WL<0>·M1 to WL<3>·M1 running in the x-direction via contact plugs $P_{WL<0>}$ to $P_{WL<3>}$, respectively.

The drain-side select gate lines SGD<0> to SGD<5> are connected to leads SGD<0>·M1 to SGD<5>·M1 running in the x-direction via contact plugs $P_{SGD<0>}$ to $P_{SHD<5>}$, respectively.

The plurality of bit lines BL<0> to BL<m> and the leads SGS·M1, WL<0>·M1 to WL<3>·M1, and SGD<0>·M1 to SGD<5>·M1 are made of, for example, a metal.

Figure 2:
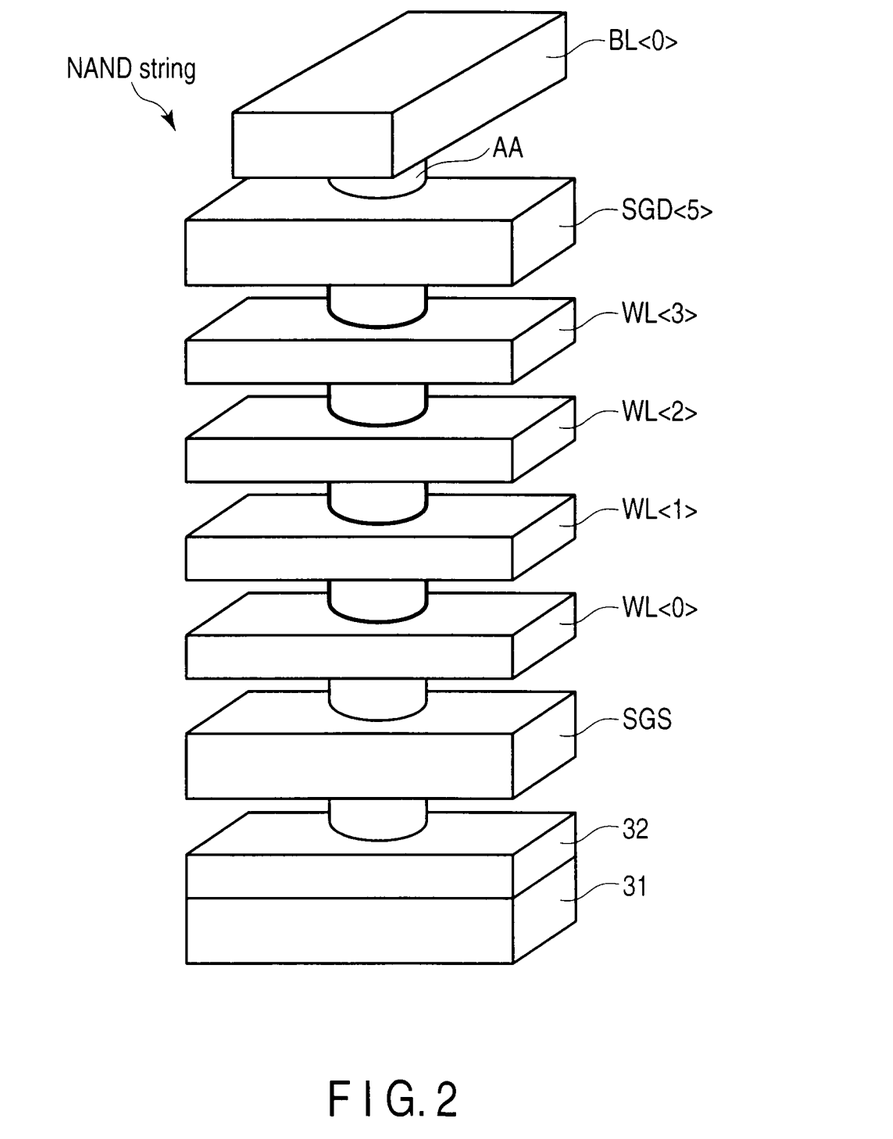
FIG. 2 is a perspective view showing the structure of one NAND string of the nonvolatile semiconductor memory device in FIG. 1.

FIG. 2 is a bird's eye view of one NAND string. Each block BK as shown in FIG. 1 has a plurality of (for example, 24) NAND strings as shown in FIG. 2. The NAND string has a plurality of memory cells, a source-side select gate transistor, and a drain-side select gate transistor.

Figure 3A:
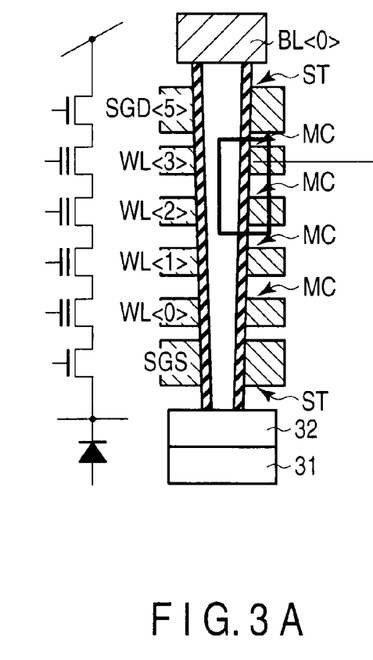
FIG. 3A is a sectional view showing the structure of one NAND string of the nonvolatile semiconductor memory device in FIG. 1.

FIG. 3A is a sectional view showing an example of the structure of one NAND string. FIG. 3B is an enlarged view of part of the structure.

Figure 3B:
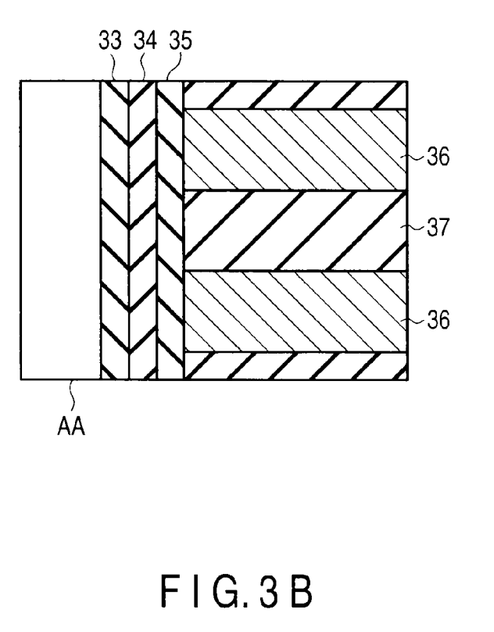
FIG. 3B is a view showing part of the structure in FIG. 3A.

As shown in FIGS. 2, 3A, and 3B, the memory cells are formed at the intersections between word lines WL<0> to WL<3> and the active layer AA formed into a pillar shape in the direction (z-direction) perpendicular to the surface of the semiconductor substrate 31. The source-side select gate transistor is formed at the intersection between the active layer AA and the source-side select gate line SGS. The drain-side select gate transistor is formed at the intersection between the active layer AA and the drain-side select gate line SGD.

The source-side select gate line SGS and the drain-side select gate line SGD are formed to sandwich the plurality of word lines WL<0> to WL<3>.

As one of the features of the NAND string having the three-dimensional structure, the drain-side select gate line SGD<5> surrounds the side surfaces of the pillar-shaped active layer AA.

Hence, for example, even if the plurality of active layers AA are made thinner to form more active layers AA on the semiconductor substrate 31 and thus increase the capacity, the driving force of the select transistors included in the NAND string can sufficiently be ensured.

As shown in FIGS. 3A and 3B, a plurality of memory cells MC and select gate transistors ST (source-side select gate transistor and drain-side select gate transistor) included in one NAND string are stacked in the z-direction with interlayer dielectric films 37 being inserted between them.

The memory cell MC has a MONOS structure. The MONOS structure is a memory structure including a charge accumulation layer made of an insulating material, for example, a nitride such as SiN. More specifically, as shown in FIG. 3B, the memory cell MC has, for example, an oxide-nitride-oxide (ONO) structure with a charge accumulation layer 34 being sandwiched between two insulating films 33 and 35. The insulating film 33 intervenes between the charge accumulation layer 34 and the active layer AA. The insulating film 33 functions as a tunnel insulating film at the time of data write and prevents charges from leaking to the active layer AA in data retention. The block insulating film 35 intervenes between the charge accumulation layer 34 and a control gate 36. The block insulating film 35 prevents charges captured by the charge accumulation layer 34 from leaking to the control gates 36. The control gates 36 are connected to the word lines WL.

Note that the memory cell MC may have an MNOS structure without the block insulating film 35.

The set of memory cell transistors M in the NAND strings, which share one word line WL, forms a page that is a unit of data read and write. The set of a plurality of NAND strings that share the word line WL forms a block that is a unit of data erase.

<Sense Amplifier and Column Address Buffer/Column Decoder>

Figure 6:
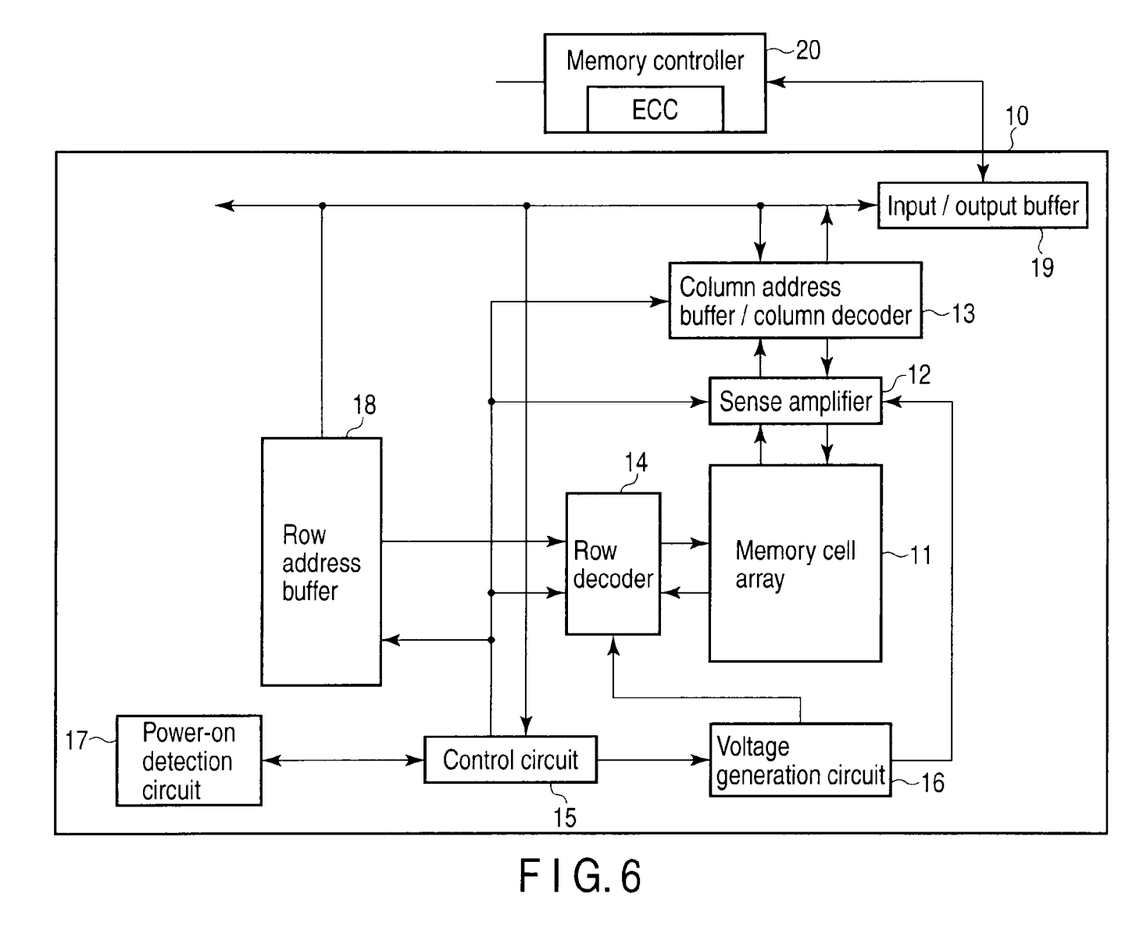
FIG. 6 is a block diagram showing the circuit arrangement of the nonvolatile semiconductor memory device according to the first embodiment.

As shown in FIG. 6, the sense amplifier 12 is connected to the memory cell array 11 via the bit lines BL. The sense amplifier 12 reads data of the memory cell array 11 for each page in the read mode, and writes data to the memory cell array 11 for each page in the write mode.

The sense amplifier 12 is also connected to the column address buffer/column decoder 13. The sense amplifier 12 decodes a selection signal input from the column address buffer/column decoder 13 (to be described later), and selects and drives one of the bit lines BL.

The sense amplifier 12 also functions as a data latch for holding data to be written. In this embodiment, each sense amplifier includes a plurality of data latch circuits (normally, in the multi-level cell (MLC) which stores 2 bits in one cell, three data latch circuits are provided).

The column address buffer/column decoder 13 temporarily stores a column address signal input from the memory controller 20 via the row address buffer 18, and outputs a selection signal to select one of the bit lines BL to the sense amplifier 12 based on the column address signal.

<Row Decoder>

The row decoder 14 decodes a row address signal input via the row address buffer 18, and selects and drives the word lines WL and the select gate lines SGD and SGS.

Note that the BiCS flash memory 10 of this embodiment has an external input/output terminal I/O (not shown). The input/output buffer 19 and the memory controller 20 exchange data via the external input/output terminal I/O. Address signals input via the external input/output terminal I/O are output to the row decoder 14 and the column address buffer/column decoder 13 via the row address buffer 18.

<Control Circuit>

The control circuit 15 performs data write and erase sequence control and read operation/control based on various kinds of control signals (for example, write enable signal WEn, read enable signal REn, command latch enable signal CLE, and address latch enable signal ALE) and commands CMD supplied via the memory controller 20. The control circuit 15 automatically performs the initialization operation upon receiving a detection signal input from the power-on detection circuit 17.

<Voltage Generation Circuit>

The voltage generation circuit 16 generates various kinds of internal voltages necessary for the write, erase, and read operations under the control of the control circuit 15. A booster circuit is used to generate an internal voltage higher than the power supply voltage.

<Power-On Detection Circuit>

The power-on detection circuit 17 is connected to the control circuit 15. The power-on detection circuit 17 detects power-on and outputs a detection signal to the control circuit 15.

<Memory Controller>

The memory controller 20 outputs necessary commands and the like to the BiCS flash memory 10 to set the operation mode (including a first write mode and a second write mode to be described later) of the BiCS flash memory 10, and performs read and write.

[Outline of Embodiment]

The nonvolatile semiconductor memory of this embodiment, the charge accumulation layers 34 are united between adjacent memory cells, as shown in FIG. 3B. For this reason, when a threshold voltage of an erased memory cell is set a negative voltage, as in a planar NAND nonvolatile semiconductor memory, the data retention of the nonvolatile semiconductor memory of this embodiment may degrade. The dominant cause is so-called unwanted charge movement. This occurs when, for example, a memory cell having a positive threshold and a memory cell having a negative threshold are adjacently arranged in the body of the same channel.

More specifically, when an erase cell with a negative threshold is adjacent to a memory cell to which a positive threshold has been written, holes and electrons recombine between the physically united charge accumulation layers so that the threshold of the memory cell to which the positive threshold has been written drops, and the threshold of the memory cell with the negative threshold rises. This degrades the data retention characteristic. Such degradation of the data retention characteristic will be referred to as unwanted data movement, and the data pattern in which the unwanted data movement occurs will be referred to as a data movement pattern hereinafter. To prevent the unwanted data movement, it is effective to set a positive erase level.

Figure 4:
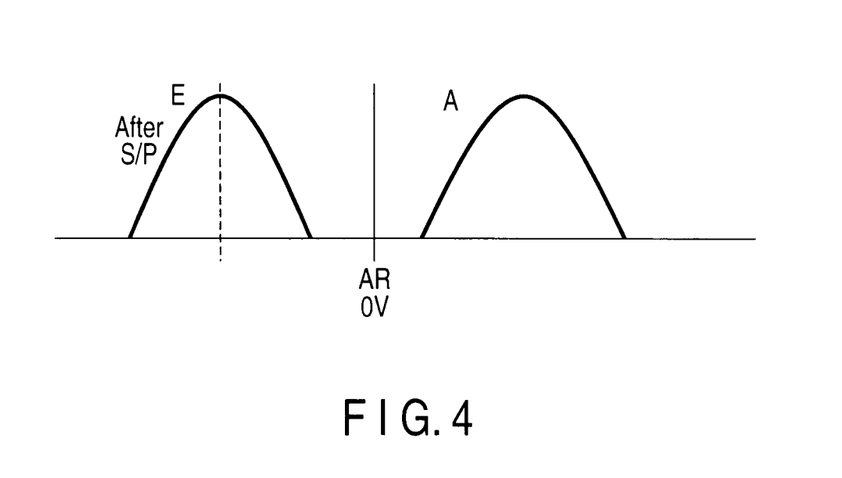
FIG. 4 is a graph showing the Vth budget of a 1-bit/cell planar NAND nonvolatile semiconductor memory device.

FIG. 4 is a graph showing the Vth budget of a 1-bit/cell planar NAND nonvolatile semiconductor memory device. In the planar NAND nonvolatile semiconductor memory device, a positive threshold is written to a write cell, and the threshold of a non-write cell is kept negative in the erase state. In this case, since writing one threshold suffices upon writing, the program voltage latch-up width $\Delta V_{PGM}$ can be set large. As a result, the number of write loops decreases, and write at a very high speed can be implemented.

Figure 5:
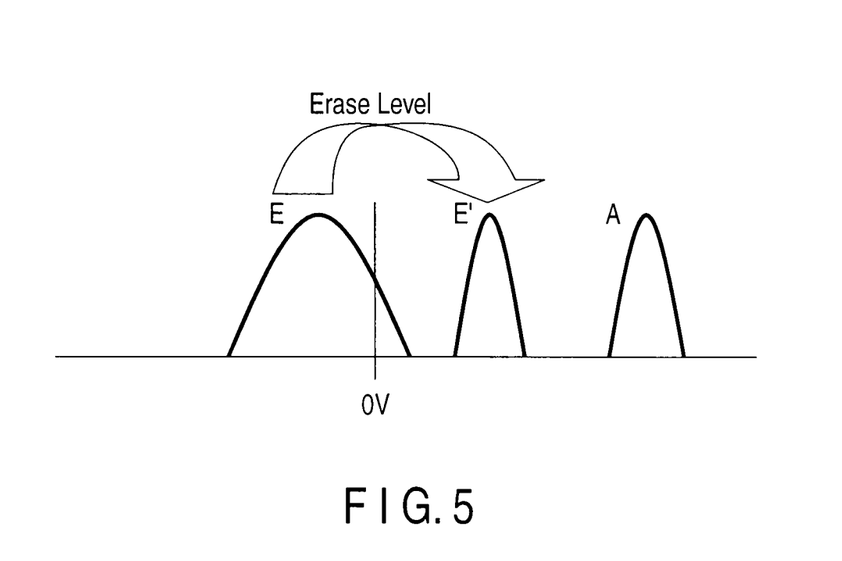
FIG. 5 is a graph showing the Vth budget of a 1-bit/cell BiCS nonvolatile semiconductor memory device.

FIG. 5 is a graph showing the Vth budget of a 1-bit/cell BiCS nonvolatile semiconductor memory device. To prevent the above-described unwanted data movement, a non-write cell needs to raise the threshold from the initial state (also referred to as a first erase state) to an erase state with a positive threshold voltage (also referred to as a second erase state that indicates the level E' in FIG. 5). A write cell needs a write to further raise the level to A. Note that the first erase state is not limited to a state in which all non-write cells have the negative threshold voltage, and some non-write cells may have the positive threshold voltage. In the second erase state, all non-write cells have the positive threshold.

A nonvolatile semiconductor memory device needs to have two positive thresholds. For this reason, to prevent overwrite to the memory cells, an initial voltage $V_{PGM}$ needs to be set low. In addition, to ensure the margin between a memory cell having the highest threshold voltage in the level E' and a memory cell having the lowest threshold voltage in the level A, $\Delta V_{PGM}$ needs to be set as small as that in upper page write to finely write the thresholds.

Hence, as compared to FIG. 5, it is necessary to make the initial voltage $V_{PGM}$ lower and $\Delta V_{PGM}$ smaller and write the threshold up to the high level A. This increases the number of pulses to be applied in a write. As a result, the write time is greatly prolonged.

To solve this problem, this embodiment provides a nonvolatile semiconductor memory device which stores a single level in one memory cell (SLC) at high speed without writing back the erase level to positive.

[Operation of Nonvolatile Semiconductor Memory Device]

Figure 7:
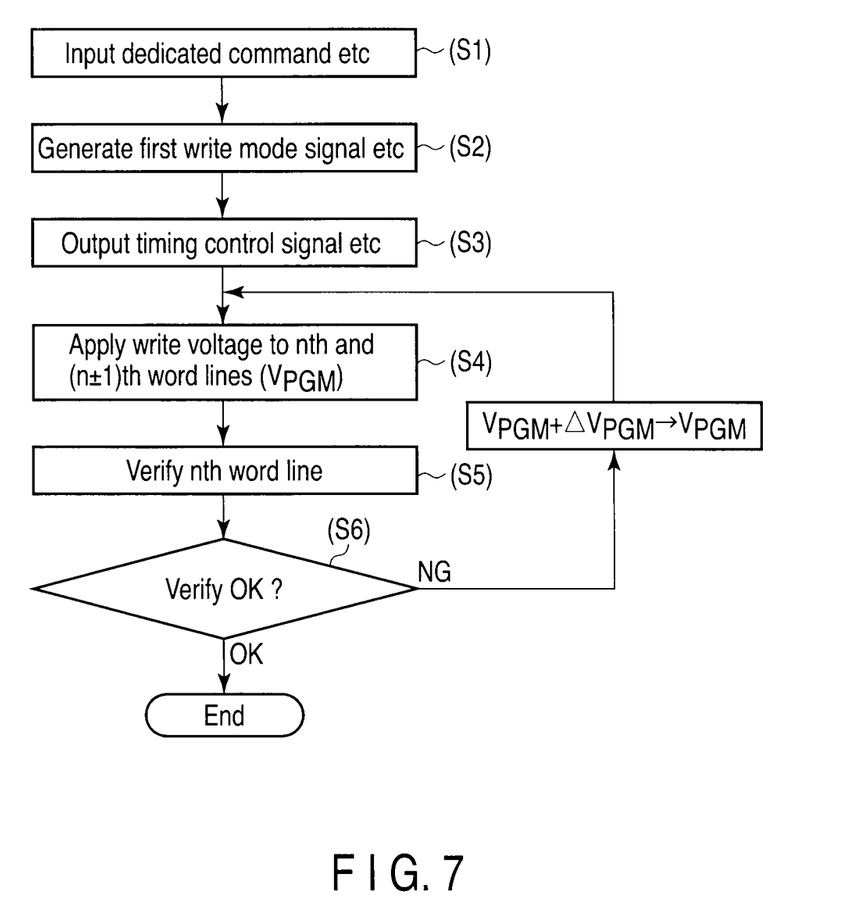
FIG. 7 is a flowchart illustrating the operation of the nonvolatile semiconductor memory device according to the first embodiment.

The write operation of the nonvolatile semiconductor memory device according to this embodiment will be described next with reference to the flowchart of FIG. 7.

In step S1, the memory controller 20 issues a write command, for example. The write command is input to the control circuit 15 via the input/output buffer 19. An address signal is input to the row address buffer 18 via the input/output buffer 19. Write data is input to the data latch circuit (not shown) of the sense amplifier 12 via the input/output buffer 19.

In step S2, the control circuit 15 receives the command input i step S1 and generates a high-speed write operation mode signal (also referred to as a first write mode signal).

In step S3, the control circuit 15 outputs a timing control signal and a voltage setting signal to generate a voltage to the voltage generation circuit 16.

In step S4, the control circuit 15 controls the sense amplifier 12, the row decoder 14, and the voltage generation circuit 16 based on an address control signal and an access control signal to the memory cells, thereby applying the same program voltage $V_{PGM}$ to a selected nth word line WL (also referred to as a selected word line WL) and the (n±1)th word lines WL in the selected block BK, where n is a natural number.

In step S5, after applying of the program voltage $V_{PGM}$, the control circuit 15 controls the sense amplifier 12, the row decoder 14, and the voltage generation circuit 16 so as to verify only memory cells connected to the nth word line.

In step S6, the control circuit 15 determines base on the verify result in step S5 whether the threshold voltages of the memory cells connected to the nth word line WL exceed a desired voltage. Steps S4 to S6 are repeated until the threshold voltages of the memory cells exceed the desired voltage. Upon determining in step S6 that the threshold voltages of the memory cells connected to the nth word line WL do not exceeded the desired voltage (NG in step S6), a voltage obtained by boosting the program voltage $V_{PGM}$ in step S4 by $\Delta V_{PGM}$ is set as a new program voltage. Then, the newly set program voltage is applied in step S4. Hence, every time it is determined in step S6 that the threshold voltages of the memory cells connected to the nth word line WL do not exceeded the desired voltage, the program voltage is boosted by $\Delta V_{PGM}$.

Figure 8:
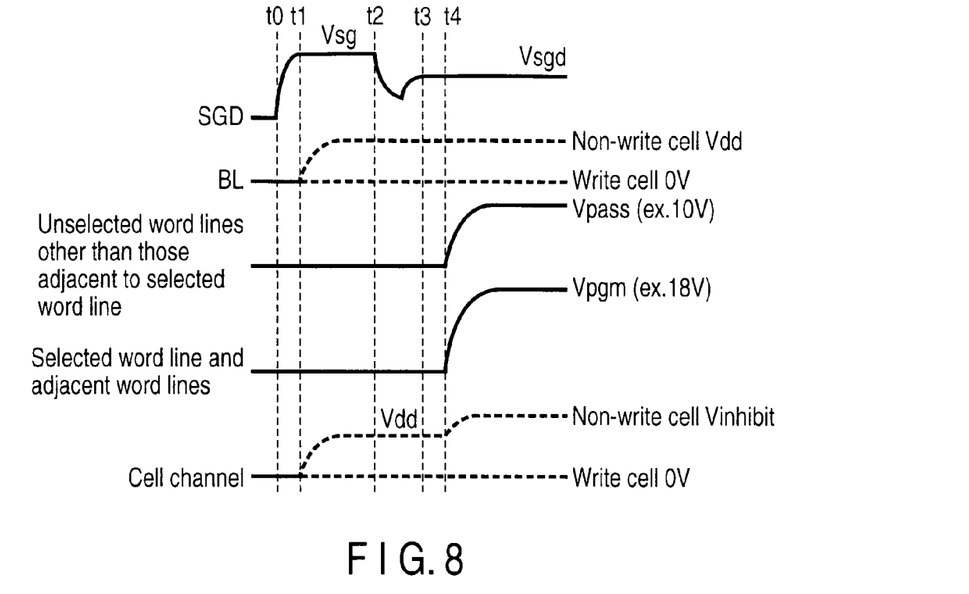
FIG. 8 is a timing chart of write according to the first embodiment.

FIG. 8 is a program timing chart of a write according to this embodiment.

The write cell and the non-write cell are controlled by the BL voltage. Zero voltage is applied to bit lines connected to write cells of "0" data. The voltage is boosted from t1 so as to apply Vdd to bit lines connected to non-write cells of "1" data.

A voltage Vsg is applied to the drain-side select gate SGD to transfer the voltage of the bit lines BL connected to the non-write cells to the cell channels. When transfer of Vdd to the cell channels is completed, the voltage is set to Vsgd. Zero voltage is applied to the source-side select gate SGS (not shown).

With this operation, the channels of the write cells can be set to 0 V, and the channels of the non-write cells can be set to Vdd in the selected NAND string. After that (after t4), a program voltage Vpgm (for example, 18 V) is applied to the three word lines WL including the selected word line WL and the word lines WL adjacent to the selected word line WL, and a voltage Vpass (for example, 10 V) is applied to the remaining word lines WL.

Figure 9:
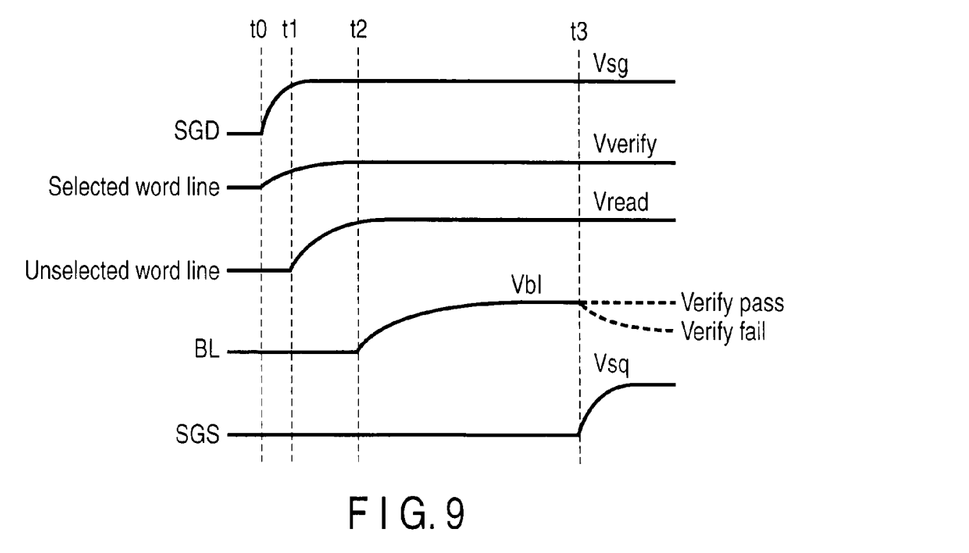
FIG. 9 is a timing chart of verify according to the first embodiment.
Figure 10:
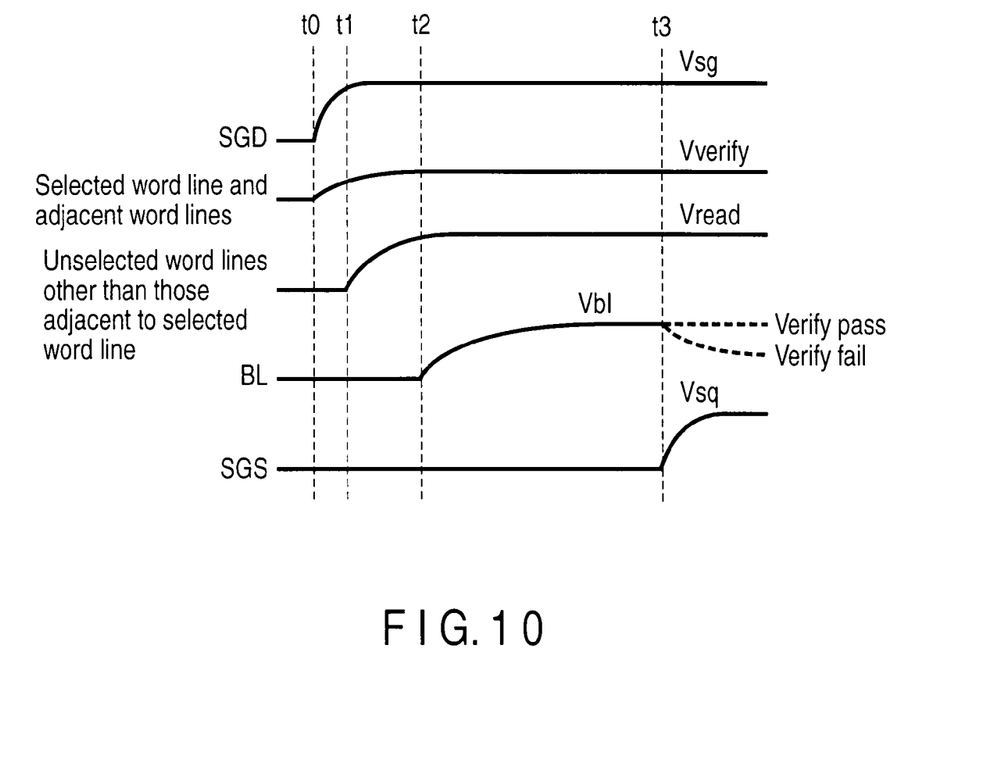
FIG. 10 is a timing chart showing another example of verify according to the first embodiment.

FIGS. 9 and 10 are program timing charts of verify.

Referring to FIG. 9, verify is executed for only the selected word line WL. This is because the (n±1)th word lines WL adjacent to the selected nth word line WL are used not to store data but to prevent unwanted charge movement of the nth word line WL. It is unnecessary to confirm whether the thresholds of the memory cells connected to the (n±1)th word lines WL exceed the verify level. Since the verify ends only in the selected word line WL, data write can advantageously speed up.

More specifically, as shown in FIG. 9, from t0, voltage Vsg is applied to the drain-side select gate SGD, and a voltage Vverify is applied to the selected word line WL. From t1, a voltage Vread is applied to the unselected word lines WL.

From t1 after t0, a voltage Vb1 is applied to the bit line BL. Verify pass/fail is determined based on whether or not the boosted voltage Vb1 drops.

From t4, a voltage Vsq is applied to the source-side select gate SGS (not shown).

Referring to FIG. 10, verify is executed for the selected word line WL and the adjacent word lines WL. In this case, since the verify is performed for the three word lines, unwanted charge movement can more reliably be prevented. In this case, since, the verify is performed for the three word lines, the thresholds of memory cells connected to the word lines on both sides of the selected word line WL are also guaranteed to be at least equal to the verify level. It is therefore possible to more reliably prevent unwanted charge movement of the memory cells connected to the selected word line WL.

[Effects of Embodiment]

Figure 11A:
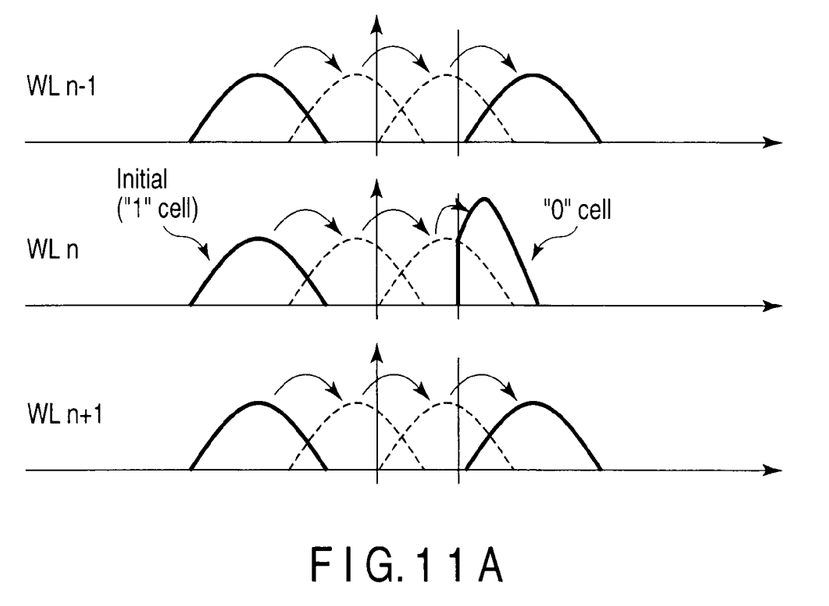
FIGS. 11A and 11B are graphs showing threshold changes upon write according to the first embodiment.
Figure 11B:
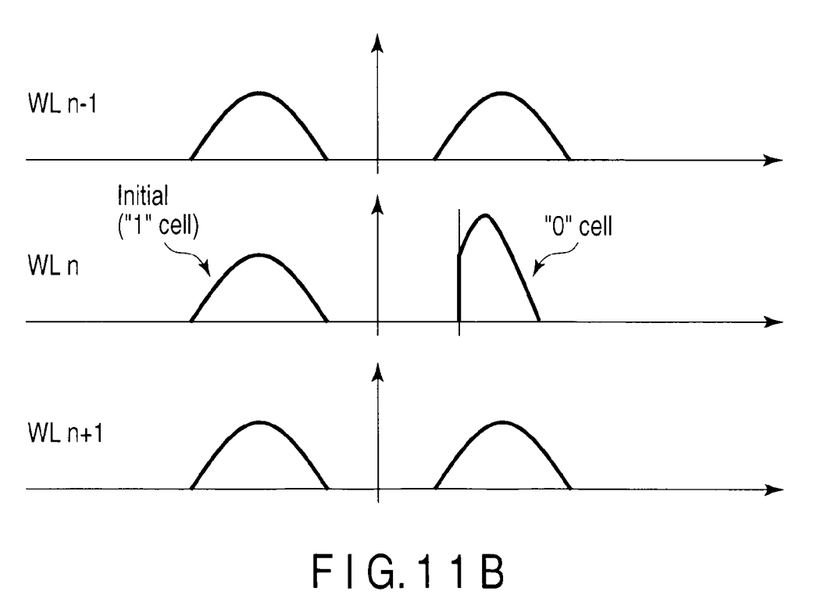
Figure 12:
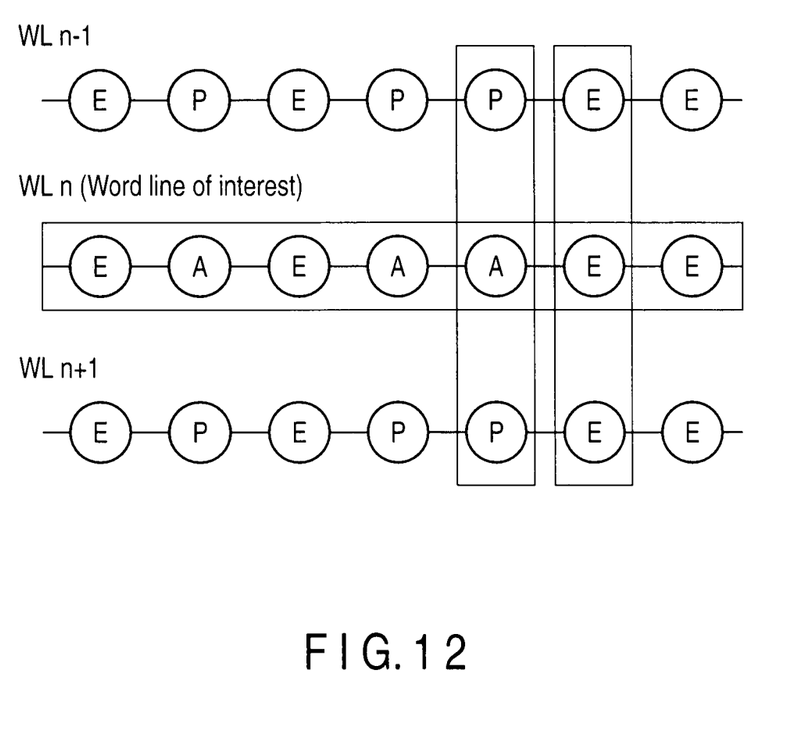
FIG. 12 is a view showing the threshold distribution of the memory cells connected to the nth and (n±1)th word lines upon write according to the first embodiment.

With the above-described arrangement, a nonvolatile semiconductor memory device capable of speeding up data write can be provided. This will be described in detail. FIGS. 11A and 11B are graphs showing the threshold distributions of the memory cells connected to the nth and (n±1)th word lines upon writing according to the first embodiment. FIG. 12 is a view showing the threshold distribution of the memory cells connected to the plurality of word lines groups when the memory cells are write-accessed.

In the nonvolatile semiconductor memory device of this embodiment, the same program voltage $V_{PGM}$ is applied to adjacent memory cells between the nth and (n±1)th word lines. For this reason, for example, steps S4 to S6 described above are repeated three times, thereby obtaining the threshold distribution as shown in FIG. 11B.

Such a write enables elimination of the unwanted data movement pattern in the memory cells connected to the word line WL of interest, as shown in FIG. 12, without writing, to all memory cells, the threshold to set the second erase state. Referring to FIG. 12, E indicates the first erase state, A is the write state more than the verify level, and P is the write state in in which the threshold is expected to be close to the verify level, although the verify is not executed in fact.

Note that the verify is executed only for the nth word line but not for the (n±1)th word lines.

As described above, like the planar NAND, the margin between the thresholds can readily be ensured, and the write speed is expected to be higher without the write to the second erase state even when the initial voltage $V_{PGM}$ and $\Delta V_{PGM}$ are set to be relatively large.

Figure 14A:
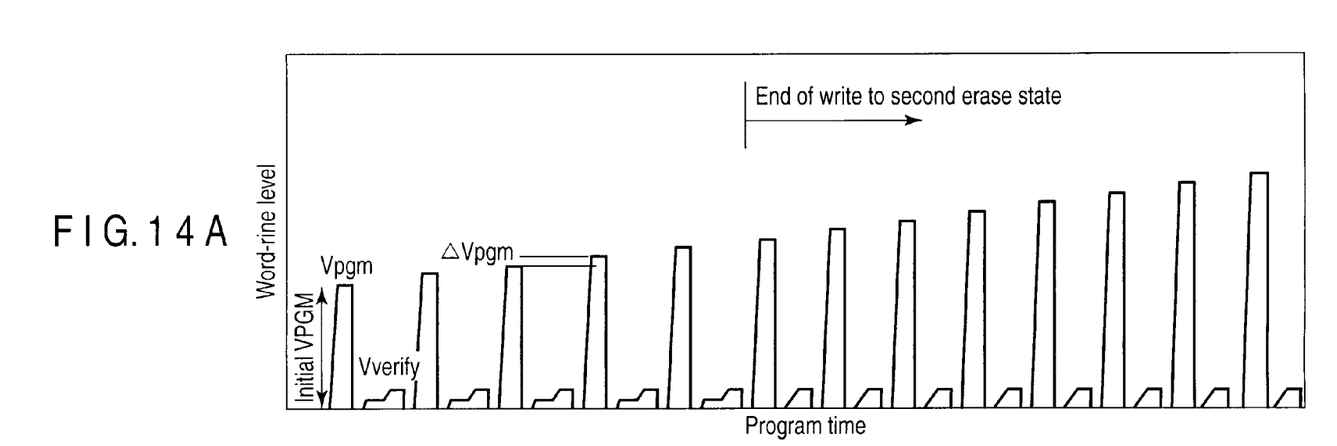
FIG. 14A is a timing chart showing a comparative example of the write operation of a nonvolatile semiconductor memory device.
Figure 14B:
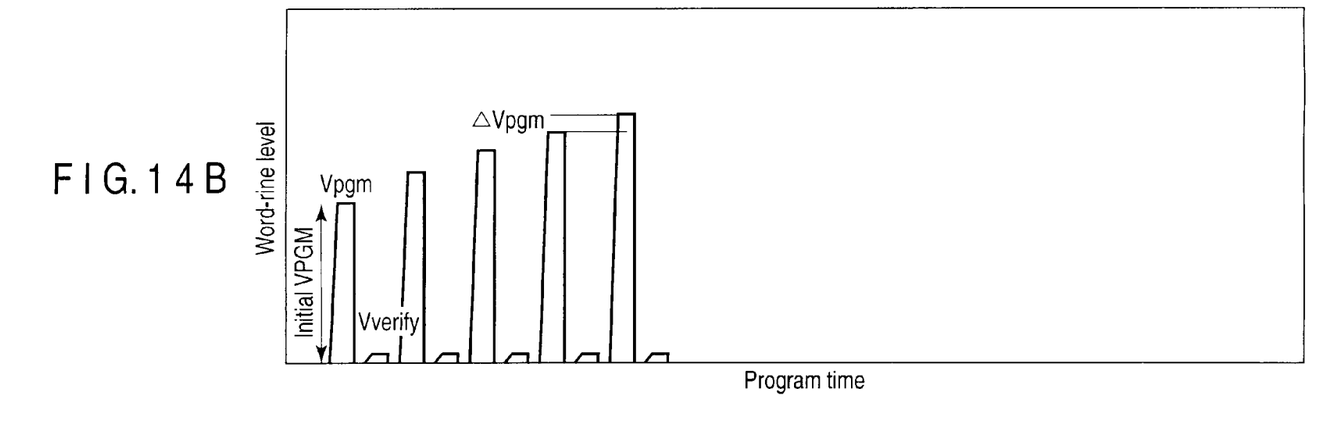
FIG. 14B is a timing chart showing the write operation of the nonvolatile semiconductor memory device according to the embodiment.

In this embodiment, the verify is executed by determining whether the threshold voltages of the memory cells connected to the nth word line exceed a desired voltage. In the nonvolatile semiconductor memory device of the prior art, the second erase state (E') needs to be verified. In this embodiment, however, the second erase state (E') need not be verified. Hence, as shown in FIGS. 14A and 14B, the nonvolatile semiconductor memory device of this embodiment (see FIG. 14B) can decrease the number of pulses to be applied, as compared to the nonvolatile semiconductor memory device of the prior art (see FIG. 14A). FIG. 14A is a timing chart showing the write operation of the nonvolatile semiconductor memory device of the prior art. FIG. 14B is a timing chart showing the write operation of the nonvolatile semiconductor memory device according to the embodiment.

According to this embodiment, it is therefore possible to provide a nonvolatile semiconductor memory device capable of speeding up data write as compared to the nonvolatile semiconductor memory device of the prior art.

After the write has been performed for the nth page (WLn), the next writable page is the (n+3)th page (WLn+3). Hence, when the SLC buffer method is used, six blocks are necessary for writing data of one block of the 2-bit/cell MLC.

Figure 13:
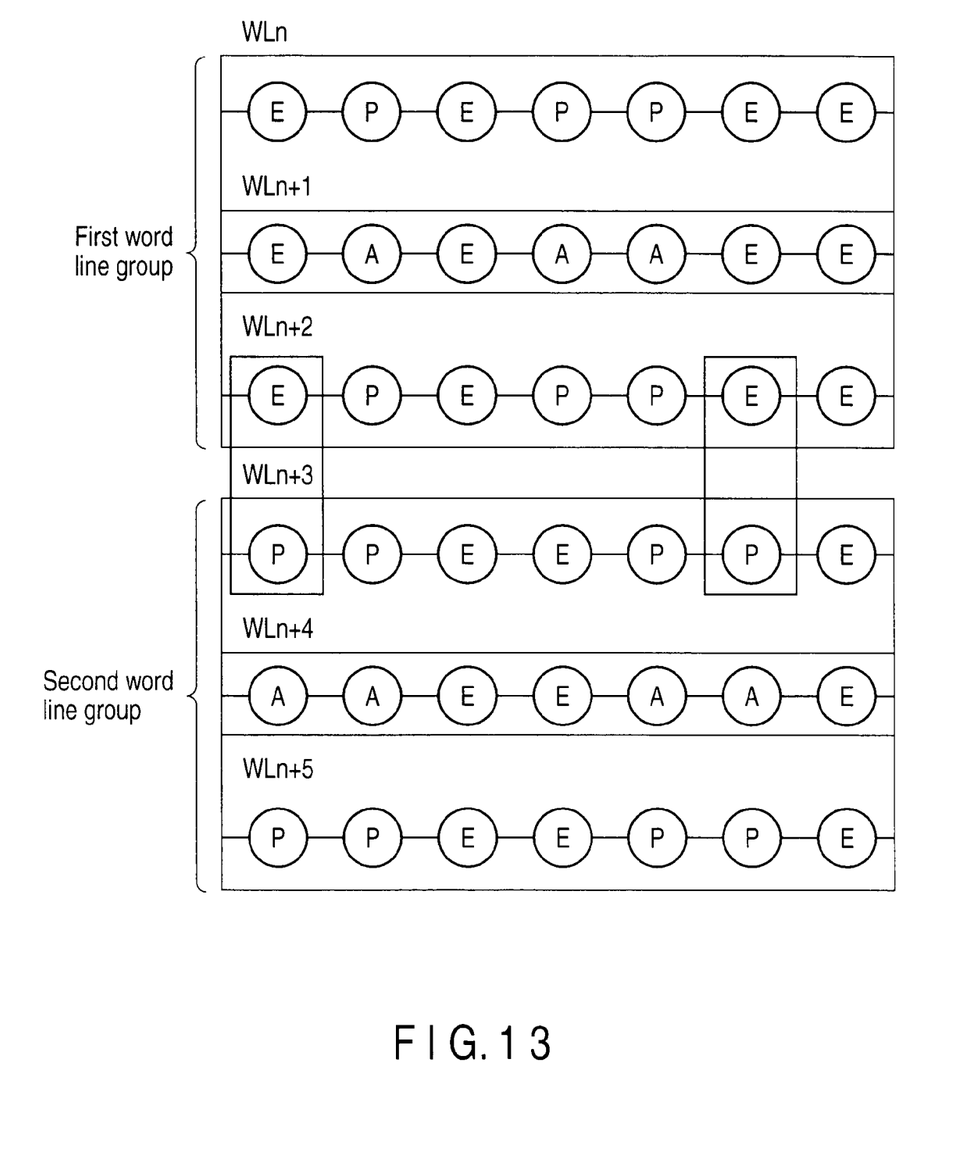
FIG. 13 is a view showing the threshold distribution of the memory cells when memory cells connected to a plurality of word line groups are write-accessed.

The effects of this embodiment will be explained in more detail with reference to FIG. 13. FIG. 13 is a schematic view showing the threshold distribution of memory cells when write is executed for a plurality of word line groups. The nth to (n+2)th word lines are put into one word line group. FIG. 13 illustrates an example of the embodiment in which data write is executed for two word line groups (a first word line group including the nth to (n+2)th word lines and a second word line group including the (n+3)th to (n+5)th word lines).

In the first word line group, the (n+1)th word line WL is selected as the word line of interest, and a write is performed simultaneously even for the adjacent nth and (n+2)th word lines WL. In the second word line group, the (n+4)th word line WL is selected as the word line of interest, and a write is performed simultaneously even for the adjacent (n+3)th and (n+5)th word lines WL.

The memory cells connected to the (n+1)th word line of the first word line group and the (n+4)th word line of the second word line group are used to store original data.

In this case, a data movement pattern may be generated depending on the relationship between the memory cells connected to the (n+2)th word line WL (first word line group) and the adjacent memory cells connected to the (n+3)th word line WL (second word line group). However, the memory cells connected to the (n+2)th and (n+3)th word lines WL do not store the original data. Hence, even if an unwanted data movement pattern is generated in these memory cells, unwanted leakage of charges accumulated in the charge accumulation layers of the memory cells connected to the (n+1)th and (n+4)th word lines, which store the original data, can be reduced. This allows to prevent data corruption and the like and to improve the data reliability.

As described above, according to this embodiment, when writing data to the memory cell group connected to the nth word line of the memory cell array, the same data is written to the memory cell groups connected to the (n−1)th word line WL and the (n+1)th word line WL, thereby speeding up the data write and improving the data reliability.

That is, data of one page is written using memory cells connected to three word lines WL. The data reliability can be improved by using the word lines WL on both sides of the word line WL of interest as a shield. In addition, only selecting the three word lines simultaneously suffices for the write, and the write time is not prolonged.

(Second Embodiment)

A nonvolatile semiconductor memory device according to the second embodiment will be described next. An example will be described in which an SLC is used as a buffer in a solid-state drive (SSD) using an MLC chip. The nonvolatile semiconductor memory device according to this embodiment and that of the first embodiment are the same in the arrangement but different in the operation method. Hence, in this embodiment, the operation method of the nonvolatile semiconductor memory device will be explained in detail.

[Operation Method of Nonvolatile Semiconductor Memory Device]

For the descriptive convenience, assume that data is written to the SLC buffer by performing so-called SLC write in steps S1 to S6 of the first embodiment.

In step SA, a control circuit 15 controls a row decoder 14, a sense amplifier 12, and the like so as to select two pages of data written to the SLC buffer.

In step SB, the control circuit 15 controls the sense amplifier 12 and the like so as to read out the data of the two pages to the sense amplifier 12 and causes the data latches in the sense amplifier 12 to hold the data.

In step SC, the control circuit 15 outputs a desired address signal in a memory cell array 11 to the row decoder 14 and the sense amplifier 12 and controls the row decoder 14, the sense amplifier 12, a voltage generation circuit 16, and the like to MLC-write the data of the two pages held by the data latches to the memory cell of the desired address.

Steps SA to SC are performed for the block write-accessed in the first embodiment. That is, steps SA to SC are repeated until data is MLC-written to all pages of the block write-accessed in the first embodiment.

In step SD, when data is MLC-written to all pages of the block write-accessed in the first embodiment, the control circuit 15 erases the data of the block written to the SLC buffer.

Note that when reading out the data of two pages to the sense amplifier 12 and causing the data latches in the sense amplifier 12 to hold the data in step SB, the readout data of the two pages may be read out to a memory controller 20 via the external input/output terminal I/O and subjected to error correction by ECC, and step SC may be performed after that.

As described above, even in the MLC chip, when high-speed data write is necessary, the SLC is used as a buffer. In this embodiment as well, it is possible to provide a nonvolatile semiconductor memory device capable of speeding up data write, as in the first embodiment.

(Third Embodiment)

A nonvolatile semiconductor memory device according to this embodiment is the same as those of the first and second embodiments except that a memory controller selects an ultrahigh-speed SLC buffer mode (first write mode) in which data write is performed for the memory cells connected to three word lines, as in the first embodiment, and a high-speed SLC buffer mode (second write mode) in which data write is performed after write is performed to change the erase state of the memory cells connected to one word line from the first erase state to the second erase state.

In this embodiment, a memory controller 20 selects one of the first write mode and the second write mode. In step S2 of the operation of the nonvolatile semiconductor memory device according to the first embodiment, the memory controller 20 of the third embodiment generates a first write mode signal when selecting the first write mode and a second write mode signal when selecting the second write mode.

In the first write mode, data of one page is written using the memory cells connected to three word lines WL, as in the first embodiment. In this mode, the same data is written to the two adjacent word lines WL as well. This obviates the necessity of writing back the thresholds of the memory cells connected to the three word lines WL to positive. It is therefore possible to perform reliable high-speed data write. The two adjacent word lines WL will be referred to as a shield page here.

In the second write mode, as shown in FIGS. 11A and 11B, data write is performed after write is performed to change the erase state of memory cells connected to one word line from the first erase state to the second erase state. In the second write mode, no shield page is needed. Hence, the number of pages to be used to store the original data can be decreased to ⅓ as compared to the first write mode. Additionally, in the second write mode, both the data reliability and the write speed are higher than in the normal MLC write, as will be described later.

As described above, according to this embodiment, for example, if the memory controller requests write at a very high speed, the memory controller 20 selects the first write mode in which data of one page is written using the region of three word lines WL. If the memory controller requests not so high write speed as compared to the first write mode, the memory controller 20 selects the second write mode. This enables optimum write control in accordance with the requested write speed.

For example, when writing data that needs high reliability, such as block management information, to the memory cell array, the memory controller 20 selects the second write mode. In this case, the data is not MLC-written but SLC-written, thereby improving the data reliability. In this way, the external memory controller generates a write mode signal in accordance with the application purpose to perform optimum write.

(Modification)

Note that the embodiment is not limited to the above-described embodiments. The memory cell array structure need not always be BiCS, and the embodiment is applicable to any nonvolatile semiconductor memory device having a stacked memory cell structure in which memory cells each having a charge accumulation layer and a control gate are stacked on a substrate. The BiCS structure is not limited to that shown in FIG. 1 at all and can be changed as needed in accordance with the specifications.

In the embodiments, application to SLC data write has been described. However, the embodiment is also applicable to MLC data write.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a memory cell array having a plurality of memory cells connected to a plurality of word lines stacked on a semiconductor substrate, the memory cells having a charge accumulation layer, and the charge accumulation layers are united between adjacent memory cells; and
   a control circuit configured to, when writing data to a memory cell group connected to an nth (n is a natural number) word line, control to simultaneously apply the same program voltage to memory cell groups connected to an (n−1)th word line and an (n+1)th word line.

2. The device according to claim 1, wherein the control circuit verifies the memory cell group connected to the nth word line, and applies the program voltage to the memory cell groups connected to the nth word line, the (n−1)th word line, and the (n+1)th word line until a threshold voltage of the memory cell group connected to the nth word line exceeds a first desired voltage.

3. The device according to claim 2, wherein the control circuit verifies the memory cell groups connected to the (n−1)th word line and the (n+1)th word line, and applies the program voltage to the memory cell groups connected to the nth word line, the (n−1)th word line, and the (n+1)th word line until the threshold voltage of the memory cell groups connected to the nth word line, the (n−1)th word line, and the (n+1)th word line exceeds a second desired voltage.

4. The device according to claim 2, which further comprises bit lines to which NAND strings including the plurality of memory cells and select gate transistors are connected, and
   in which the control circuit applies a non-program voltage to a bit line electrically connected to a memory cell which has passed in the verify, and applies a program voltage to a bit line electrically connected to a memory cell which has failed in the verify.

5. The device according to claim 2, wherein the memory cell array comprises:
   a pillar-shaped active layer formed on the semiconductor substrate;
   a gate insulating film formed to surround side walls of the active layer, the gate insulating film including a tunnel insulating film, the charge accumulation layer, and a block insulating film; and
   a layered structure portion formed to surround side walls of the gate insulating film portion, the layered structure portion including a plurality of interlayer dielectric films and a plurality of conductive layers stacked alternately on the semiconductor substrate, and
   the memory cell is formed from a transistor including a silicon layer, the tunnel insulating film, the charge accumulation layer, the block insulating film, and the conductive layer.

6. The device according to claim 2, wherein the control circuit selects one of a first write mode and a second write mode in accordance with a requested write speed,
   in the first write mode, when writing the data to the memory cell group connected to the nth word line, the same program voltage is simultaneously applied to the memory cell groups connected to the (n−1)th word line and the (n+1)th word line, and
   in the second write mode, a third desired voltage is applied to, out of the memory cell group connected to the nth word line, a memory cell in a first erase state to set the memory cell in a second erase state.

7. A nonvolatile semiconductor memory device comprising:
   a plurality of word lines stacked on a semiconductor substrate;
   a NAND string in which a plurality of memory cells each having a charge accumulation layer are connected, the charge accumulation layers are united between adjacent memory cells, and each of the memory cells is connected to each of the word lines; and
   a control circuit which simultaneously applies the same program voltage to an (n−1)th word line and an (n+1)th word line when writing data to a memory cell which is connected to an nth-word line.

8. The device according to claim 7, wherein the control circuit verifies the memory cell connected to the nth word line, and applies the program voltage to the memory cell connected to the nth word line, the (n−1)th word line, and the (n+1)th word line until a threshold voltage of the memory cell connected to the nth word line exceeds a first desired voltage.

9. The device according to claim 8, wherein the control circuit verifies the memory cell connected to the (n−1)th word line and the (n+1)th word line, and applies the program voltage to the memory cell connected to the nth word line, the (n−1)th word line, and the (n+1)th word line until the threshold voltage of the memory cell connected to the nth word line, the (n−1)th word line, and the (n+1)th word line exceeds a second desired voltage.

10. The device according to claim 8, which further comprises a bit line to which the NAND string and a select gate transistor are connected, and
    in which the control circuit applies a non-program voltage to a bit line electrically connected to a memory cell which has passed in the verify, and applies a program voltage to a bit line electrically connected to a memory cell which has failed in the verify.

11. The device according to claim 8, wherein the NAND string comprises:
    a pillar-shaped active layer formed on the semiconductor substrate;
    a gate insulating film formed to surround side walls of the active layer, the gate insulating film portion including a tunnel insulating film, the charge accumulation layer, and a block insulating film; and
    a layered structure portion formed to surround side walls of the gate insulating film, the layered structure portion including a plurality of interlayer dielectric films and a plurality of conductive layers stacked alternately on the semiconductor substrate, and
    the memory cell is formed from a transistor including a silicon layer, the tunnel insulating film, the charge accumulation layer, the block insulating film, and the conductive layer.

12. The device according to claim 8, wherein the control circuit selects one of a first write mode and a second write mode in accordance with a requested write speed,
    in the first write mode, when writing the data to the memory cell connected to the nth word line, the same program voltage is simultaneously applied to the memory cell groups connected to the (n−1)th word line and the (n+1)th word line, and
    in the second write mode, a third desired voltage is applied to, out of the memory cell connected to the nth word line, a memory cell in a first erase state to set the memory cell in a second erase state.

* * * * *